(12) United States Patent
Dasgupta et al.

(10) Patent No.: US 9,847,448 B2
(45) Date of Patent: Dec. 19, 2017

(54) FORMING LED STRUCTURES ON SILICON FINS

(71) Applicant: Intel Corporation, Santa Clara, CA (US)

(72) Inventors: Sansaptak Dasgupta, Hillsboro, OR (US); Han Wui Then, Portland, OR (US); Robert S. Chau, Beaverton, OR (US); Marko Radosavljevic, Beaverton, OR (US); Benjamin Chu-Kung, Portland, OR (US); Sanaz Gardner, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/906,542

(22) PCT Filed: Sep. 27, 2013

(86) PCT No.: PCT/US2013/062181
§ 371 (c)(1),
(2) Date: Jan. 20, 2016

(87) PCT Pub. No.: WO2015/047300
PCT Pub. Date: Apr. 2, 2015

(65) Prior Publication Data
US 2016/0163918 A1 Jun. 9, 2016

(51) Int. Cl.
*H01L 33/32* (2010.01)
*H01L 27/15* (2006.01)
(Continued)

(52) U.S. Cl.
CPC ............ *H01L 33/06* (2013.01); *H01L 27/153* (2013.01); *H01L 33/007* (2013.01);
(Continued)

(58) Field of Classification Search
CPC ... H01L 33/06; H01L 33/0025; H01L 33/007; H01L 33/16; H01L 33/20; H01L 33/30; H01L 33/325; H01L 33/62
See application file for complete search history.

(56) References Cited

U.S. PATENT DOCUMENTS 3,593,070 A * 7/1971 Reed ................. H01L 23/36
257/735
5,977,612 A * 11/1999 Bour ................. B82Y 20/00
257/103

(Continued)

FOREIGN PATENT DOCUMENTS

JP 2010-068010 A 3/2010
JP 2012-060172 A 3/2012
(Continued)

OTHER PUBLICATIONS

Second Office Action including Search Report (8 pages) dated Oct. 21, 2016 issued by the Examiner of the Intellectual Property Office (the IPO) for Taiwan Patent Application No. 103133286 and English Translation (7 pages) thereof.
(Continued)

*Primary Examiner* — Benjamin Sandvik
*Assistant Examiner* — Gustavo Ramallo
(74) *Attorney, Agent, or Firm* — Schwabe, Williamson & Wyatt P.C.

(57) ABSTRACT

Methods of forming III-V LED structures on silicon fin templates are described. Those methods and structures may include forming an n-doped III-V layer on a silicon (111) plane of a silicon fin, forming a quantum well layer on the n-doped III-V layer, forming a p-doped III-V layer on the quantum well layer, and then forming an ohmic contact layer on the p-doped III-V layer.

30 Claims, 7 Drawing Sheets

(51) Int. Cl.
   *H01L 33/00*  (2010.01)
   *H01L 33/06*  (2010.01)
   *H01L 33/16*  (2010.01)
   *H01L 33/62*  (2010.01)
   *H01L 33/20*  (2010.01)
   *H01L 21/02*  (2006.01)

(52) U.S. Cl.
   CPC .......... *H01L 33/0025* (2013.01); *H01L 33/16* (2013.01); *H01L 33/32* (2013.01); *H01L 33/325* (2013.01); *H01L 33/62* (2013.01); H01L 21/0243 (2013.01); H01L 21/0254 (2013.01); H01L 21/02381 (2013.01); H01L 21/02433 (2013.01); H01L 21/02458 (2013.01); H01L 33/20 (2013.01); H01L 2933/0033 (2013.01)

(56) References Cited

U.S. PATENT DOCUMENTS

| | | | |
|---|---|---|---|
| 6,555,403 B1* | 4/2003 | Domen | B82Y 20/00 257/10 |
| 2002/0078881 A1 | 6/2002 | Cuomo | C23C 14/0063 117/84 |
| 2004/0061178 A1* | 4/2004 | Lin | H01L 29/1054 257/350 |
| 2004/0070990 A1* | 4/2004 | Szypszak | G01N 21/8806 362/555 |
| 2005/0035355 A1* | 2/2005 | Konno | H01L 33/387 257/79 |
| 2005/0281304 A1* | 12/2005 | Mochida | B82Y 20/00 372/46.01 |
| 2006/0169987 A1 | 8/2006 | Miura et al. | |
| 2007/0187697 A1* | 8/2007 | Wu | B82Y 20/00 257/79 |
| 2008/0083930 A1* | 4/2008 | Edmond | H01L 33/42 257/98 |
| 2009/0261363 A1 | 10/2009 | Chen et al. | |
| 2011/0121330 A1 | 5/2011 | Tak et al. | |
| 2011/0309324 A1 | 12/2011 | Goswami | |
| 2012/0267607 A1* | 10/2012 | Zhang | H01L 21/0237 257/13 |
| 2013/0214248 A1* | 8/2013 | Goswami | H01L 21/0237 257/13 |
| 2014/0239341 A1 | 8/2014 | Matsumura | |

FOREIGN PATENT DOCUMENTS

| | | |
|---|---|---|
| KR | 10-2006-0014106 A | 2/2006 |
| TW | 2009-01521 A | 1/2009 |

OTHER PUBLICATIONS

Notification of Transmittal of the International Search Report and the Written Opinion of the International Searching Authority for PCT/US2013/062181 filed Sep. 27, 3013, dated Jun. 23, 2014, 15 pages.

Notification of Transmittal of the International Search Report and the Written Opinion of the International Searching Authority for PCT/US2013/062181 filed Sep. 27, 3013, dated Apr. 7, 2016, 15 pages.

Communication and Extended Search Report (7 pages) dated Jan. 1, 2017 from the European Patent Office for European Patent Application No. 13894641.3-1551/03050130, PCT/US2013/062181.

Notice of Allowance (2 pages) dated Mar. 3, 2017 from Taiwan Intellectual Property Office for Taiwan Patent Application No. 103133286 thereof.

Communication pursuant to Rules 70(2) and 70a(2) EPC dated Feb. 2, 2017 from the European Patent Office for EP Patent Application No. 13894641.2-1551 (PCT/US2013/062181).

Office Action including Search Report issued by the Examiner of the Intellectual Property Office (the IPO) dated Mar. 16, 2016 for Taiwan Patent Application No. 103133286.

Office Action for Chinese Patent Application No. 201380079214.6, dated Oct. 9, 2017, 7 pgs.

Office Action for Taiwan Patent Application No. 106110334, dated Oct. 27, 2017, 6 pgs., with English translation.

* cited by examiner

FORMING LED STRUCTURES ON SILICON FINS

This patent application is a U.S. National Phase Application under 35 U.S.C. 371 of International Application No. PCT/US2013/062181 filed Sep. 27, 2013.

BACK GROUND OF THE INVENTION

Integration of III-V materials, such as gallium nitride, onto (100) silicon surfaces (100) is highly desired for such applications as system on chip (SoC) high voltage and RF devices, as well as for complementary metal oxide silicon (CMOS) applications. This integration involves fabrication challenges that may arise due to the mismatch in lattice properties between the two materials. This lattice mismatch, which may be near forty two percent, may cause epitaxial growth of low defect density III-V materials to become prohibitive. Additionally, the large thermal mismatch between gallium nitride and silicon (which is about one hundred and sixteen percent) coupled with conventional high growth temperatures for gallium nitride, can result in the formation of surface cracks on epitaxial layers, thus inhibiting the use of III-V materials with (100) for device fabrication.

BRIEF DESCRIPTION OF THE DRAWINGS

While the specification concludes with claims particularly pointing out and distinctly claiming certain embodiments, the advantages of these embodiments can be more readily ascertained from the following description of the invention when read in conjunction with the accompanying drawings in which:

DETAILED DESCRIPTION OF THE PRESENT INVENTION

Figure 1A:
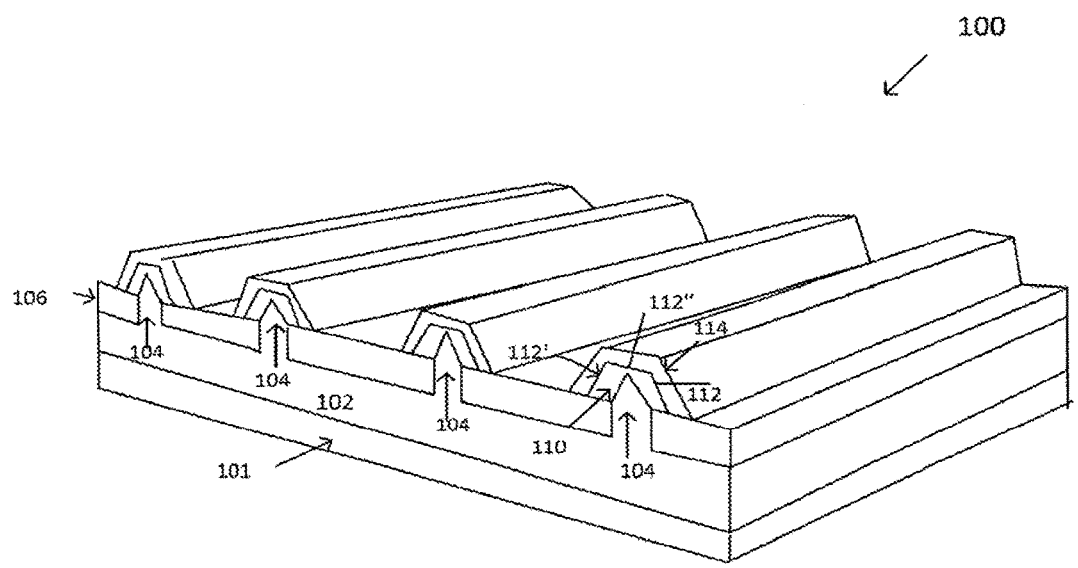
FIGS. 1a-1e represent cross-sectional views of structures according to various embodiments.

In the following detailed description, reference is made to the accompanying drawings that show, by way of illustration, specific embodiments in which the methods and structures may be practiced. These embodiments are described in sufficient detail to enable those skilled in the art to practice the embodiments. It is to be understood that the various embodiments, although different, are not necessarily mutually exclusive. For example, a particular feature, structure, or characteristic described herein, in connection with one embodiment, may be implemented within other embodiments without departing from the spirit and scope of the embodiments. In addition, it is to be understood that the location or arrangement of individual elements within each disclosed embodiment may be modified without departing from the spirit and scope of the embodiments. The following detailed description is, therefore, not to be taken in a limiting sense, and the scope of the embodiments is defined only by the appended claims, appropriately interpreted, along with the full range of equivalents to which the claims are entitled.

In the drawings, like numerals may refer to the same or similar functionality throughout the several views.

Methods and associated structures of forming and utilizing microelectronic and optoelectronic structures, such as III-V LED structures formed on silicon (111) planes of silicon nanostructure templates, are described. Those methods/structures may include forming an n-doped III-V layer on a silicon (111) plane of a silicon fin, forming a quantum well layer on the n-doped III-V layer, forming a p-doped III-V layer on the quantum well layer, and then forming an ohmic contact layer on the p-doped III-V layer. The III-V LED structures of the various embodiments disclosed herein enable gallium nitride LED's on c-plane and m-plane, as well as enhancing light intensity and performance.

FIGS. 1a-1e illustrate cross-sectional views of embodiments of forming microelectronic structures, such as III-V LED devices on silicon (111) fin crystal planes. In an embodiment, a device 100, which may comprise a portion of an LED device 100, may comprise a substrate 102 (FIG. 1a). The substrate 102 may comprise a silicon substrate having a (100) crystallographic plane. In an embodiment, the substrate 102 may comprise a (100) silicon wafer, and may be n-doped with an n-type material/element such as phosphorus, for example. In another embodiment, the substrate 102 may comprise a n+ doped layer at a bottom portion to enable low resistance ohmic contacts. The silicon substrate 102 may comprise circuit elements, such as transistors and passive elements, for example. In an embodiment, the substrate 102 may comprise a portion of a CMOS substrate 102. A silicon fin 104 may be disposed on the substrate 102. In an embodiment, the silicon fin 104 may comprise a top portion 105 (see FIG. 1c). In an embodiment, the top portion 105 of the silicon fin 104 may comprise an apex 113. The top portion 105 of the silicon fin 104 may comprise (111) silicon crystallographic planes 107, 107. In an embodiment, the (111) silicon fin is n-doped. The (111) planes can be formed by wet etch of a silicon i fin using etchants like TMAH which terminate at the (111) surface. In an embodiment, a plurality of adjacent silicon fins 104 may be formed/disposed on the substrate 102 (referring back to FIG. 1a).

In an embodiment, an oxide layer, such as a shallow trench isolation (STI) layer 106, may be formed adjacent silicon fins. The STI 106 may be formed in portions of the substrate 102, wherein the top portion 105 of the silicon fin is exposed, and the remainder of the silicon fin is protected/covered by the STI 106. In an embodiment, an n-doped III-V material/layer 110 may be formed on the (111) planes of the top portion 105 of the silicon fin 104, where the III portion may comprise any of the group III elements from the periodic chart, and the V portion may comprise elements from group V of the periodic chart, such as nitride, for example.

In an embodiment, the n-doped III-V layer 110 may comprise one of a a gallium nitride and an indium gallium nitride material. The n-doped III-V layer 110 may be grown utilizing epitaxial growth. The epitaxial growth may comprise lateral epitaxial growth. Because the silicon nanofin 104 is nanoscale (10-50 nm thick) the portion on which the III-V material grows is more compliant than blanket large area III-V material growth on silicon wafers. This results in strain transfer into the nanoscale fins thereby reducing the onset of plastic relaxation in the epitaxially grown III-V layer. Additionally, because the silicon fin 104 comprises a three dimensional nature, there is more free surface area available for the n-doped III-V material 108 to experience free surface relaxation, hence increasing the critical thickness for onset of dislocation defect creation. In prior art transistor and LED structures, blanket growth of III-V on (100) and (111) silicon wafers is typically required. The embodiments herein enable the formation of a virtually defect free n-doped III-V layer 110 comprising little to no defects.

Additionally, unlike prior art LED structures, thick buffer layers are not required for the formation of the III-V material 110, which produces faster growth, less cost and easier integration of the III-V material with devices, such as silicon system on chip (SoC) devices, for example. The III-V layer 110 only grows from the silicon (111) plane of the silicon fin. In an embodiment, the n-doped III-V layer may comprise a thickness between about 40 nm to about 100 nm. In typical, prior art buffer growth approaches for LED structures, the n-doped GaN layer and the underlying layers could easily exceed greater than 3 microns in thickness.

A quantum well layer 112, such as an indium gallium nitride and/or a gallium nitride may be formed on the n-doped III-V layer 110. In an embodiment, an indium gallium nitride portion of the quantum well layer may comprise between about 5 percent to about 30 percent by weight of indium, and the thickness of the indium gallium nitride layer is around 5 to about −10 nm (depending on the indium gallium nitride composition, an LED of the embodiments herein will emit blue/green light). A gallium nitride or a low composition AlGaN (Al<20%) may be used for a barrier of the quantum well layer 112, and may comprise a thickness of about 5 to about 10 nm. In an embodiment, the quantum well layer may comprise a multi quantum well (MQW) 112. In an embodiment, the multi-quantum well may comprise at least 5 layers of the indium gallium nitride/GaN layer disposed on the gallium nitride layer.

In an embodiment, the multi quantum well may also comprise an aluminum gallium nitride layer disposed on a gallium nitride layer, which may be used in ultra violet (UV) applications and deep-UV LEDs. AlGaN/GaN multi-quantum wells or $Al_xGa_{1-x}N/Al_yGa_{1-y}N$ (where x>y) MQW structures could also be used as the active area for the UV-LEDs. A p-doped layer 114 may be formed on the quantum layer 112. In an embodiment, the quantum well may grow on three surface on the n-doped III-V layer 110, wherein enhanced surface area is available per footprint for enhanced light extraction. In an embodiment, the quantum well layer may comprise two side portions 112, 112' and a top portion 112".

In an embodiment, the quantum well layer portions 112, 112 formed on the silicon (111) sidewalls of the silicon fin 104 are grown on the c-plane, whereas the quantum well portion grown on the top portion 112" are grown on the m-plane of gallium nitride. The m-plane typically is non-polar and hence has no polarization fields which are observed in the c-plane. This polarization field leads to the quantum confined stark effect (QCSE), which would not be present in the m-plane. The QCSE leads to lower luminosity in III-V LEDS's and also to efficiency droop at higher current injection levels, such as gallium nitride LEDs, In an embodiment, the hybrid LED structure 100 may comprise MQWS on both the m-plane and c-plane of GaN, wherein the net efficiency droop is lower than pure c-plane GaN LEDs. Also, for the same In composition in the quantum well, due to the absence of QCSE in the m-plane region, the LED 100 emission wavelength may be slightly adjusted, and hence offers another knob for producing a broader spectrum LED (larger emission wavelength spread) from one individual LED structure. The percentage of m-plane surface and c-plane surface for the MQW layers is typically determined by the thickness of the n-doped III-V layer 110. The thicker the n-doped III-V layer 110 it is grown, the more m-plane area becomes exposed. Additionally, a structure as in FIG. 1e (described subsequently herein, wherein the top portion of the fin is covered by a dielectric) enables thicker n-doped III-V layers 110 without merging, and hence enables larger m-plane surface areas.

Figure 1B:
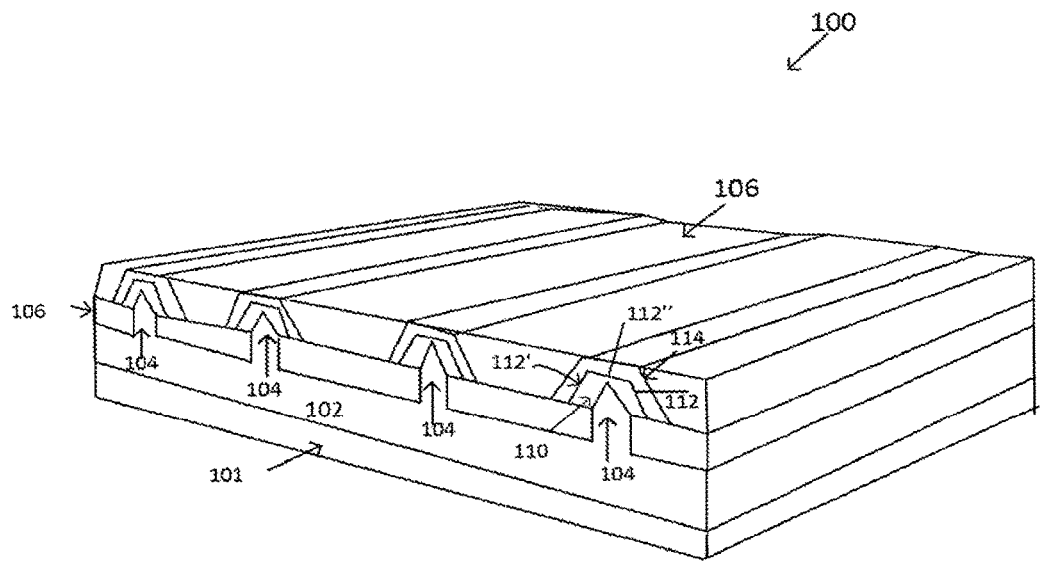
Figure 1C:
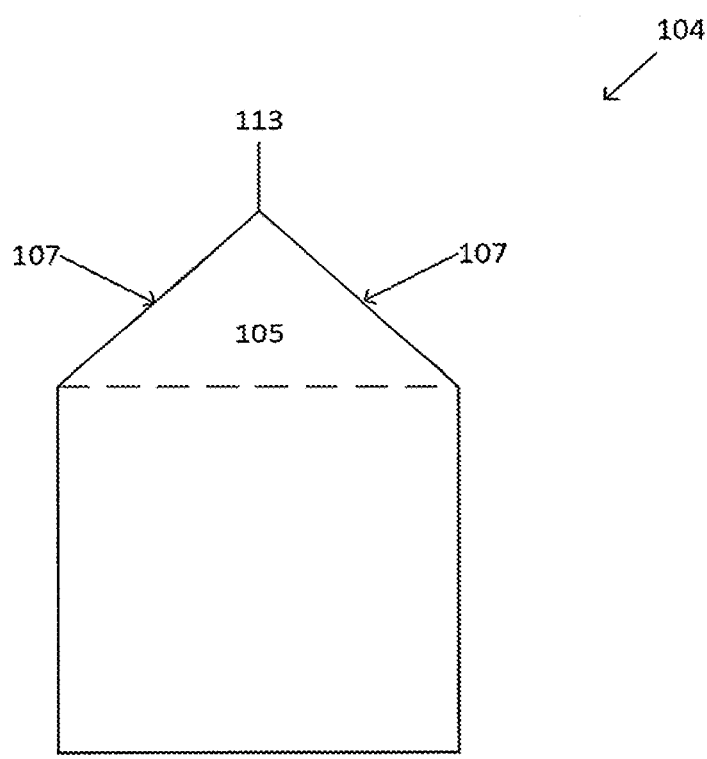

In an embodiment, a p-doped III-V layer 114 may be formed on the quantum well layer 112. In an embodiment, the p-doped III-V layer may comprise a thickness of between about 40 to about 150 nm. In an embodiment, a transparent dielectric 116, such as an indium tin oxide (ITO) transparent oxide, may be formed on the p-doped III-V layer 114 (FIG. 1b). In an embodiment, the transparent dielectric 116 may comprise an ohmic contact layer 116 to the p-doped III-V layer 114. An n-type contact 101, which may comprise a metal contact, may be formed on the backside of the substrate 102, and may be made through the n doped silicon substrate 102.

Figure 1D:
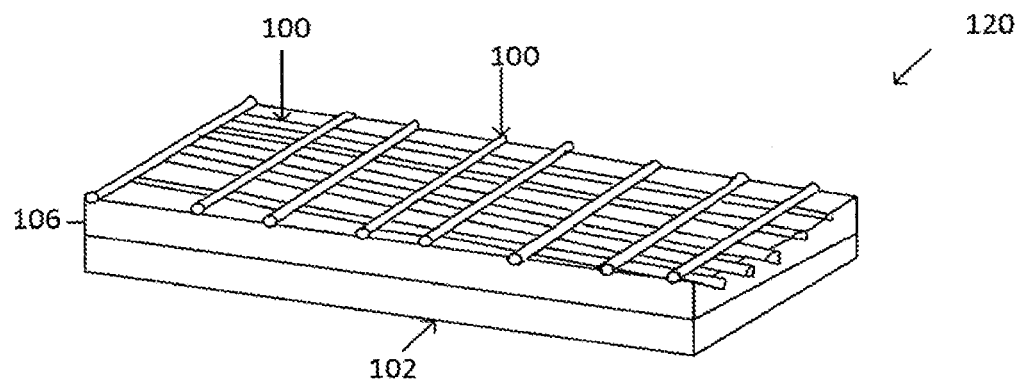

Arrays of LED structures 100 may be laid out in a criss-cross fashion to maximize the density of the structures and hence increase light intensity (FIG. 1d). The arrays maximize the LED 100 surface area on the substrate/wafer 102. The LED structures may be isolated from each other by an STI 106. Such arrays of optoelectronic structures may also be used for hybrid circuits which utilize both microelectronic circuits and optical interconnects.

Figure 1E:
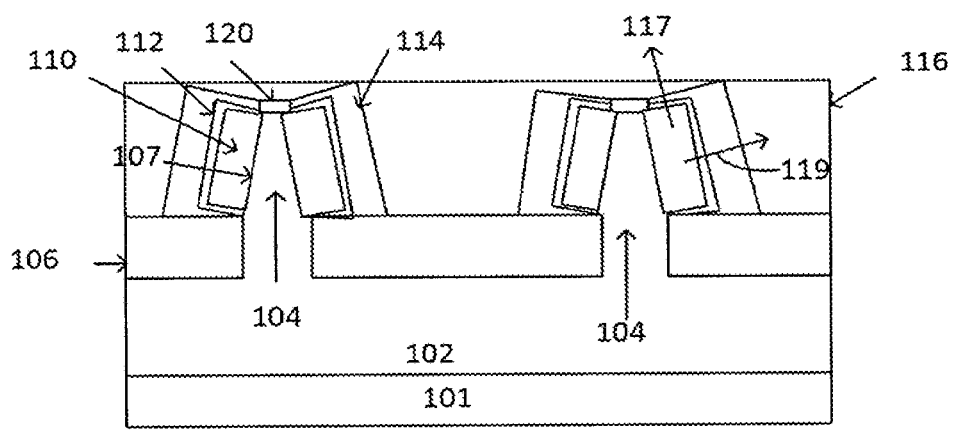

In another embodiment, a top portion of the silicon fin 104 may be covered with a dielectric material 120, such as an oxide liner 120, wherein the (111) planes 107 of the silicon fin 104 are the only ones exposed (FIG. 1e). An n-doped III-V layer 110 may be formed on the (111) planes 107, a quantum well 112 may be formed on the n-doped III-V layer 110, and a p-doped III-V layer 114 may be formed on the quantum well 112. A transparent dielectric 116, such as an ITO, may be formed on the LED and in between adjacent LED structures to form a p-ohmic contact. Adjacent nano-fins 104 may be separated by STI 106, and may be disposed on an n-type substrate 102, which may comprise a silicon (100) substrate. An n type material 101 may comprise an n-type contact, and may be adjacent the substrate 102. The indium gallium nitride/gallium nitride (InGaN/GaN) quantum wells, which are responsible for the LED light emission, can now be oriented along different crystal planes.

For example, the plane growing out of the silicon (111) surface 107 of the silicon fin 104 may be in the c-plane 119, and the perpendicular to that plane being the m-plane 117. Both these planes 119, 117 (which figure has these labeled?) have different properties with respect to frequency of light emission and also LED operation. Thus, more variety of colors may be achieved when using the LED's of the embodiments herein. In general, growth of the III-V layers on the silicon (111) nanotemplates can result in the growth of III-V crystals with multiple crystal planes simultaneously. These planes have polarization properties which are useful for LED devices.

Figure 2:
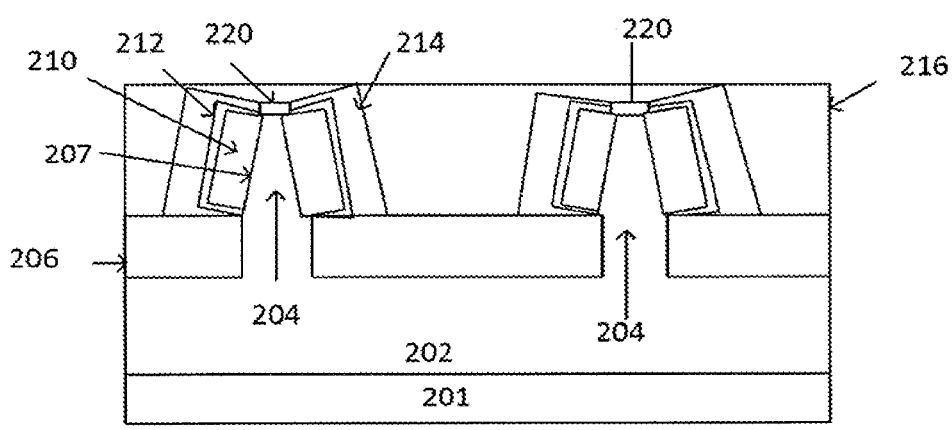
FIG. 2 represents a cross-sectional view of structures according to embodiments.

In FIG. 2, an embodiment, wherein an LED structure is shown in which the substrate wafer 202 comprises a p+ silicon substrate 202, wherein the ohmic contact 201 is made to the p+ substrate 202. This is important because the p-ohmic contact to III-V layers, such as gallium nitride layers, tends to be poor, with high specific contact resistivity. However, it is possible to get very low contact resistance to p+ doped silicon (100) wafers. The lower the contact resistance, the better performing the LED and its efficiency is also improved. It is, however, relatively easy to get low contact resistance for n-type III-V films. The ohmic contact

216 may comprise a transparent contact metal such as nickel, gold and alloys thereof.

A top portion of the silicon fin 204 may be covered with a dielectric material 220, such as an oxide liner 220, wherein the (111) planes 207 of the silicon fin 204 are the only ones exposed. A p-doped III-V layer 210 may be formed on the (111) planes, a quantum well 212 may be formed on the p-doped III-V layer 210, and an n-doped III-V layer 214 may be formed on the quantum well 212. A transparent dielectric 216, such as an ITO 216, may be formed on the LED and in between adjacent LED structures to form an n-ohmic contact. Adjacent nanofins 204 may be separated by STI 206.

Figure 5:
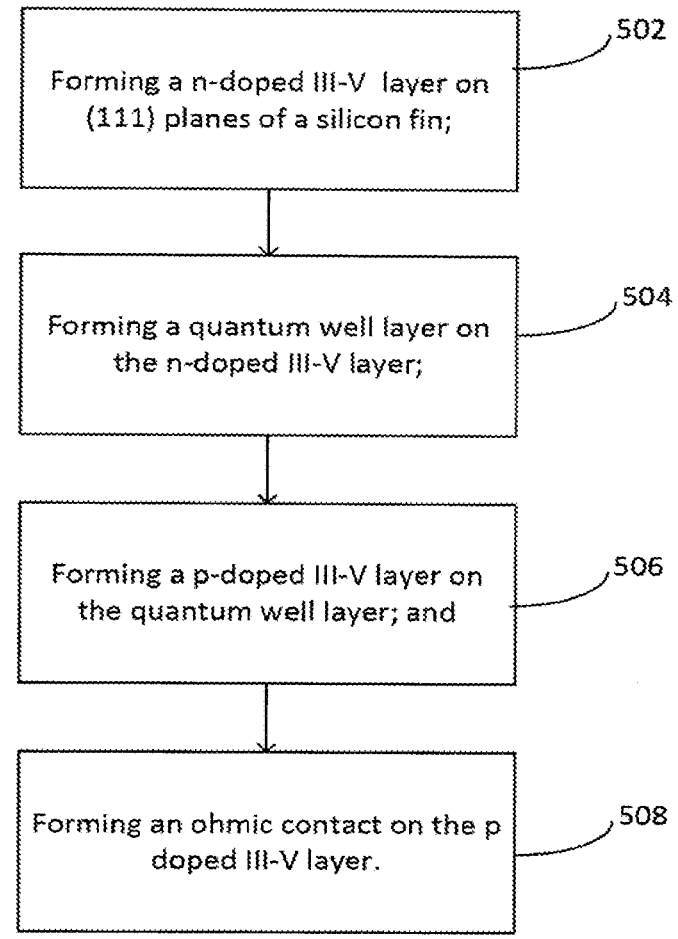
FIG. 5 represents a flow chart of a method according to embodiments.

FIG. 5 depicts a method according to embodiments herein. At step 502, an n-doped III-V layer may be formed on (111) planes of a silicon fin. At step 504, a quantum well layer may be formed on the n-doped III-V layer. At step 506, a p-doped III-V layer may be formed on the quantum well layer. At step 508, an ohmic contact may be formed on the p doped III-V layer.

In an embodiment, the LED devices of the embodiments herein may be coupled with any suitable type of package structures capable of providing electrical communications between a microelectronic device, such as a die and a next-level component to which the package structures may be coupled (e.g., a circuit board). In another embodiment, the devices herein may be coupled with a package structure that may comprise any suitable type of package structures capable of providing electrical communication between a die and an upper integrated circuit (IC) package coupled with the devices herein.

The devices of the embodiments may comprise circuitry elements such as LED structures. The devices may be coupled with other circuitry elements that may comprise logic circuitry for use in a processor die, for example. Metallization layers and insulating material may be included in the devices herein, as well as conductive contacts/bumps that may couple metal layers/interconnects to external devices/layers. In an embodiment, the bumps may comprise copper.

The devices described in the various Figures herein may comprise portions of a silicon logic die or a memory die, for example, or any type of suitable microelectronic device/die. In some embodiments the devices may further comprise a plurality of dies, which may be stacked upon one another, depending upon the particular embodiment. In some cases the die(s) of the devices herein may be located/attached/embedded on either the front side, back side or on/in some combination of the front and back sides of a package structure. In an embodiment, the die(s) may be partially or fully embedded in a package structure of the embodiments.

The various embodiments of the III-V structures formed on (111) enable a more densely packed LED structure, which can be obtained by forming high quality III-V layers on silicon (111) nanostructure/nanofin templates. The 3D nature of the LED epitaxial layers leads to enhanced surface area and hence higher light emission than those of typical prior art, planar LED devices. The embodiments herein enable the integration of large area silicon wafers (for example, 300 mm and larger), without the use of thick and complex buffer stacks (greater than 2.5 microns in many cases), as are typically utilized in prior art devices. Thus embodiments herein lead to lower epitaxial fabrication costs.

Additionally, large area epitaxial films of III-V materials on nanotemplates may be grown on silicon (100) substrate to be used for growing lasers/LED's and other III-V optoelectronic devices. SOC products that may require integrated LED's for display, such as smart phones, notebooks, tablets, and other electronic mobile devices are enabled. Base station wireless transmission networks, electric power conversion technology in power transmission networks, and electric vehicle technologies are enabled. LED/laser and other III-N optoelectronic devices are supported. The embodiments increase/enhance light intensity and provide low defect density coupled with large scale silicon substrate implementation.

The embodiments also allow for the use of thermally and lattice mis-matched systems on a silicon substrate, leading to thinner epitaxy and lower defect density in the epitaxy film. Nanostructures with silicon (111) planes are used to grow III-V epitaxy. Silicon (111) has lower mismatch with GaN as compared with Si (100). For example, GaN has lower lattice mismatch to (111) silicon (17%) as opposed to (100) silicon (100) (~40%). The hexagonal unit cell provides symmetry thus aiding in better crystal registry of the hexagonal III-V materials, such as GaN, on top of the (111) silicon.

Fabrication of III-V based blue and green LED's on (111) silicon planes of a silicon fin are described. Fabrication of III-V LED's on both the c-plane and the m-plane of III-V crystals simultaneously is enabled in the embodiments herein, producing enhanced light intensity and performance. Typical prior art III-V LED's are made from blanket substrates and hence the resulting LED is on a fixed crystal plane. A nanotemplate, like a silicon fin or a nanoribbon or nanowire, in theory, offers several advantages for growth of lattice mismatched epitaxial films. The 'substrate' is now compliant, due to less substrate volume and also due to the shape of the nanotemplate has free surfaces available for the epitaxial film to undergo free surface relaxation. In this approach, which is "bufferless", one can grow thin layers (1-40 nm) of epitaxial films and due to the strain sharing effects because of substrate compliance and free surface relaxation, thin films of III-N materials on silicon can be grown with low defect density suitable for device layers.

Additionally, the LED driver circuits which are typically made from silicon (100) CMOS technology can now be co-integrated with the III-V LEDs on the same chip.

Figure 3:
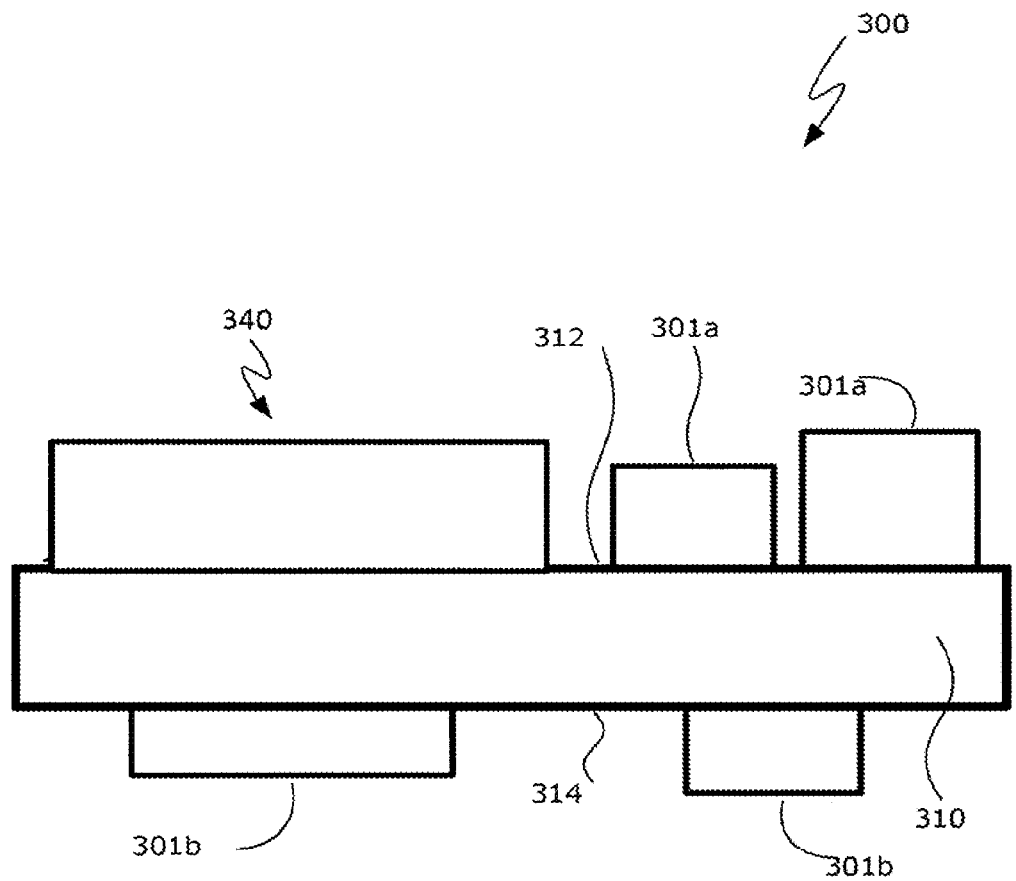
FIG. 3 represents a cross-sectional view of a system according to embodiments.

Turning now to FIG. 3, illustrated is a cross section of an embodiment of a computing system 300. The system 300 includes a number of components disposed on a mainboard 310 or other circuit board. Mainboard 310 includes a first side 312 and an opposing second side 314, and various components may be disposed on either one or both of the first and second sides 312, 314. In the illustrated embodiment, the computing system 300 includes a package structure 340 disposed on the mainboard's first side 312, wherein the package structure 340 may comprise any of the LED device structure embodiments described herein.

System 300 may comprise any type of computing system, such as, for example, a hand-held or mobile computing device (e.g., a cell phone, a smart phone, a mobile internet device, a music player, a tablet computer, a laptop computer, a nettop computer, etc.). However, the disclosed embodiments are not limited to hand-held and other mobile computing devices and these embodiments may find application in other types of computing systems, such as desk-top computers and servers.

Mainboard 310 may comprise any suitable type of circuit board or other substrate capable of providing electrical communication between one or more of the various components disposed on the board. In one embodiment, for example, the mainboard 310 comprises a printed circuit board (PCB) comprising multiple metal layers separated from one another by a layer of dielectric material and interconnected by electrically conductive vias. Any one or more of the metal layers may be formed in a desired circuit pattern to route—perhaps in conjunction with other metal layers—electrical signals between the components coupled with the board 310. However, it should be understood that the disclosed embodiments are not limited to the above-described PCB and, further, that mainboard 310 may comprise any other suitable substrate.

In addition to the package structure 340, one or more additional components may be disposed on either one or both sides 312, 314 of the mainboard 310. By way of example, as shown in the figures, components 301a may be disposed on the first side 312 of the mainboard 310, and components 301b may be disposed on the mainboard's opposing side 314. Additional components that may be disposed on the mainboard 310 include other IC devices (e.g., processing devices, memory devices, signal processing devices, wireless communication devices, graphics controllers and/or drivers, audio processors and/or controllers, etc.), power delivery components (e.g., a voltage regulator and/or other power management devices, a power supply such as a battery, and/or passive devices such as a capacitor), and one or more user interface devices (e.g., an audio input device, an audio output device, a keypad or other data entry device such as a touch screen display, and/or a graphics display, etc.), as well as any combination of these and/or other devices.

In one embodiment, the computing system 300 includes a radiation shield. In a further embodiment, the computing system 300 includes a cooling solution. In yet another embodiment, the computing system 300 includes an antenna. In yet a further embodiment, the assembly 300 may be disposed within a housing or case. Where the mainboard 310 is disposed within a housing, some of the components of computer system 300—e.g., a user interface device, such as a display or keypad, and/or a power supply, such as a battery—may be electrically coupled with the mainboard 310 (and/or a component disposed on this board) but may be mechanically coupled with the housing.

Figure 4:
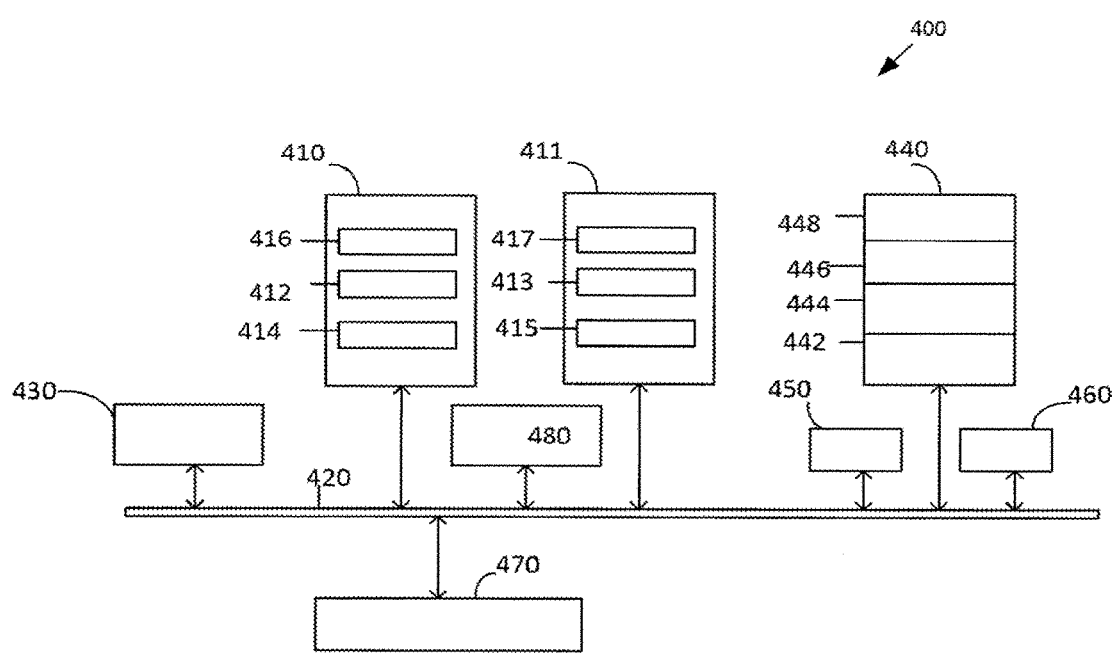
FIG. 4 represents a schematic of a system according to embodiments.

FIG. 4 is a schematic of a computer system 400 according to an embodiment. The computer system 400 (also referred to as the electronic system 400) as depicted can embody/include a package structure that includes any of the several disclosed embodiments of LED devices and their equivalents as set forth in this disclosure. The computer system 400 may be a mobile device such as a netbook computer. The computer system 400 may be a mobile device such as a wireless smart phone. The computer system 400 may be a desktop computer. The computer system 400 may be a hand-held reader. The computer system 400 may be integral to an automobile. The computer system 400 may be integral to a television.

In an embodiment, the electronic system 400 is a computer system that includes a system bus 420 to electrically couple the various components of the electronic system 400. The system bus 420 is a single bus or any combination of busses according to various embodiments. The electronic system 400 includes a voltage source 430 that provides power to the integrated circuit 410. In some embodiments, the voltage source 430 supplies current to the integrated circuit 410 through the system bus 420.

The integrated circuit 410 is electrically coupled to the system bus 420 and includes any circuit, or combination of circuits according to an embodiment, including the package/device of the various embodiments included herein. In an embodiment, the integrated circuit 410 includes a processor 412 that can include any type of LED structures according to the embodiments herein. As used herein, the processor 412 may mean any type of circuit such as, but not limited to, a microprocessor, a microcontroller, a graphics processor, a digital signal processor, or another processor. In an embodiment, the processor 412 includes any of the embodiments of the device structures disclosed herein. In an embodiment, SRAM embodiments are found in memory caches of the processor.

Other types of circuits that can be included in the integrated circuit 410 are a custom circuit or an application-specific integrated circuit (ASIC), such as a communications circuit 414 for use in wireless devices such as cellular telephones, smart phones, pagers, portable computers, two-way radios, and similar electronic systems. In an embodiment, the processor 412 includes on-die memory 416 such as static random-access memory (SRAM). In an embodiment, the processor 412 includes embedded on-die memory 416 such as embedded dynamic random-access memory (eDRAM).

In an embodiment, the integrated circuit 410 is complemented with a subsequent integrated circuit 411. In an embodiment, the dual integrated circuit 411 includes embedded on-die memory 417 such as eDRAM. The dual integrated circuit 411 includes an RFIC dual processor 413 and a dual communications circuit 415 and dual on-die memory 417 such as SRAM. The dual communications circuit 415 may be configured for RF processing.

At least one passive device 480 is coupled to the subsequent integrated circuit 411. In an embodiment, the electronic system 400 also includes an external memory 440 that in turn may include one or more memory elements suitable to the particular application, such as a main memory 442 in the form of RAM, one or more hard drives 444, and/or one or more drives that handle removable media 446, such as diskettes, compact disks (CDs), digital variable disks (DVDs), flash memory drives, and other removable media known in the art. The external memory 440 may also be embedded memory 448. In an embodiment, the electronic system 400 also includes a display device 450, and an audio output 460. In an embodiment, the electronic system 400 includes an input device such as a controller 470 that may be a keyboard, mouse, touch pad, keypad, trackball, game controller, microphone, voice-recognition device, or any other input device that inputs information into the electronic system 400. In an embodiment, an input device 470 includes a camera. In an embodiment, an input device 470 includes a digital sound recorder. In an embodiment, an input device 470 includes a camera and a digital sound recorder.

Although the foregoing description has specified certain steps and materials that may be used in the methods of the embodiments, those skilled in the art will appreciate that many modifications and substitutions may be made. Accordingly, it is intended that all such modifications, alterations, substitutions and additions be considered to fall within the spirit and scope of the embodiments as defined by the appended claims. In addition, the Figures provided herein illustrate only portions of exemplary microelectronic devices and associated package structures that pertain to the practice of the embodiments. Thus the embodiments are not limited to the structures described herein.

What is claimed is:

1. A method of forming a light emitting diode (LED) structure comprising:
   forming a silicon fin structure above a substrate, the silicon fin structure having an upper fin portion protruding through and above an insulating layer, the upper fin portion having a first surface and a second surface that meet at an apex, and the first surface and the second surface having an exposed silicon (111) plane;

forming an n-doped III-V layer on the silicon (111) plane of the first surface and the second surface of the upper fin portion of the silicon fin structure;

forming a quantum well layer on the p-doped III-V layer;

forming a p-doped III-V layer on the quantum well layer; and forming an ohmic contact layer on the p-doped III-V layer.

2. The method of claim 1 further comprising wherein the n doped III-V layer comprises one of gallium nitride and indium gallium nitride.

3. The method of claim 1 further comprising wherein the n-doped III-V layer is epitaxially grown, and comprises a thickness of between about 40 nm and about 150 nm.

4. The method of claim 1 further comprising wherein the n-doped III-V layer is substantially defect free.

5. The method of claim 1 further comprising wherein the quantum well layer comprises a multi-quantum well structure that comprises at least one of an indium gallium nitride layer, an aluminum gallium nitride layer and a gallium nitride layer.

6. The method of claim 5 further comprising wherein the indium gallium nitride layer comprises about 5 to about 30 percent indium by weight, and wherein a thickness of the indium gallium nitride layer comprises between about 5 to about 10 nm.

7. The method of claim 5 further comprising wherein the gallium nitride layer comprises a thickness of between about 5 to about 10 nm.

8. The method of claim 5 wherein the multi-quantum well may comprise at least about 5 layers, wherein each layer comprises a gallium nitride layer disposed on an indium gallium nitride layer.

9. The method of claim 1 further comprising wherein the p-doped III-V layer comprises a gallium nitride layer, and comprises a thickness between about 40 nm and about 50 nm.

10. The method of claim 9 further comprising wherein forming a plurality of LED's on in an array on a (100) substrate.

11. The method of claim 1 further comprising wherein the silicon fin is disposed on an n-doped silicon (100) substrate, wherein the substrate comprises a portion of a system on a chip.

12. The method of claim 1 further comprising wherein the ohmic contact comprises an indium tin oxide.

13. The method of claim 11 further comprising forming an n-type metal on a backside of the substrate.

14. The method of claim 1 further comprising wherein the quantum well layer comprises a top portion and two side portions, wherein the side portions are grown on the silicon (111) planes of the silicon nanofin.

15. The method of claim 14 further comprising wherein the quantum well layer grown the side portions are grown on a c-plane, and the quantum well layer grown on the top portion are grown on the m-plane.

16. The method of claim 1 further comprising wherein a top portion of the silicon fin is covered by a dielectric material, wherein the quantum well layer grown on the side portions comprise a c-plane, and the quantum well layer grown on the top portion comprises an m plane.

17. A method of forming an LED structure comprising:

forming a silicon fin on a p+ doped silicon (100) substrate, the silicon fin having an upper fin portion protruding through and above an insulating layer, the upper fin portion having a first surface and a second surface that meet at an apex, and the first surface and the second surface having an exposed silicon (111) plane;

forming an p-doped III-V layer on the silicon (111) plane of the first surface and the second surface of the upper fin portion of the silicon fin;

forming a quantum well structure on the III-V layer;

forming an n doped III-V layer on the quantum well structure;

forming an n type ohmic contact layer on the n-doped III-V layer; and forming a p contact metal on a back side of the substrate.

18. The method of claim 17 further comprising wherein the n doped III-V layer and the p doped III-V layer comprise at least one of gallium nitride and indium gallium nitride are epitaxially grown.

19. The method of claim 17 further comprising wherein the n type ohmic contact comprises at least one of a nickel material, a gold material, and alloys thereof.

20. An LED structure comprising:

a silicon fin above a substrate, the silicon fin having an upper fin portion protruding through and above an insulating layer, the upper fin portion having a first surface and a second surface that meet at an apex, and the first surface and the second surface having an exposed silicon (111) plane;

an n-doped III-V layer disposed on the silicon (111) plane of the first surface and the second surface of the upper fin portion of the silicon fin;

a quantum well layer disposed on the n-doped III-V layer;

a p-doped III-V layer disposed on the quantum well layer; and an ohmic contact layer disposed on the p-doped III-V layer.

21. The structure of claim 20 further comprising wherein the n-doped III-V layer and the p-doped III-V layer comprise one of a gallium nitride and indium gallium nitride.

22. The structure of claim 20 further comprising wherein the n-doped III-V layer is epitaxially grown, and comprises a thickness of between about 40 nm and about 150 nm.

23. The structure of claim 20 further comprising wherein the n-doped III-V layer is substantially defect free.

24. The structure of claim 20 further comprising wherein the quantum well layer comprises a multi-quantum well structure that comprises at least one of an indium gallium nitride layer, an aluminum gallium nitride layer and a gallium nitride layer.

25. The structure of claim 24 further comprising wherein the indium gallium nitride layer comprises about 5 to about 30 percent indium by weight, and wherein a thickness of the indium gallium nitride layer comprises between about 5 to about 10 nm, and wherein the gallium nitride layer comprises a thickness of between about 5 to about 10 nm.

26. The structure of claim 20 further comprising wherein the silicon fin is disposed on an n-doped silicon (100) substrate, wherein the substrate comprises a portion of a system on a chip.

27. The structure of claim 20 further comprising wherein the ohmic contact layer comprises an indium tin oxide.

28. The structure of claim 20 further comprising wherein the quantum well layer comprises a top portion and two side portions, wherein the side portions comprises a c-plane, and the top portion comprises an m plane.

29. The method of claim 20 further comprising wherein the LED structure comprises a portion of a blue/green LED device.

30. The structure of claim 20 further comprising a system comprising:
 a bus communicatively coupled to the LED structure; and
 an eDRAM communicatively coupled to the bus.

* * * * *